United States Patent
Zhou et al.

(10) Patent No.: US 11,165,422 B2
(45) Date of Patent: Nov. 2, 2021

(54) GATE DRIVER CIRCUIT WITH REDUCED POWER SEMICONDUCTOR CONDUCTION LOSS

(71) Applicant: DELTA ELECTRONICS, INC., Neihu (TW)

(72) Inventors: Yan Zhou, Canton, MI (US); Krzysztof Klesyk, Novi, MI (US); Richard Joseph Hampo, Ann Arbor, MI (US); Yingying Gui, Novi, MI (US)

(73) Assignee: DELTA ELECTRONICS, INC., Neihu (TW)

( * ) Notice: Subject to any disclaimer, the term of this patent is extended or adjusted under 35 U.S.C. 154(b) by 0 days.

(21) Appl. No.: 16/837,896

(22) Filed: Apr. 1, 2020

(65) Prior Publication Data
US 2021/0313980 A1 Oct. 7, 2021

(51) Int. Cl.
*H03K 17/28* (2006.01)
*H03K 17/10* (2006.01)
*H03K 17/284* (2006.01)

(52) U.S. Cl.
CPC ............ *H03K 17/28* (2013.01); *H03K 17/10* (2013.01); *H03K 17/102* (2013.01); *H03K 17/284* (2013.01)

(58) Field of Classification Search
CPC ...... H03K 17/28; H03K 17/284; H03K 17/10; H03K 17/102
See application file for complete search history.

(56) References Cited

U.S. PATENT DOCUMENTS

| | | |
|---|---|---|
| 3,291,999 A | 12/1966 | Lipman |
| 3,335,291 A | 8/1967 | Gutzwiller |
| 3,631,528 A | 12/1971 | Green |
| 3,710,062 A | 1/1973 | Peters, Jr. |
| 3,889,195 A | 6/1975 | Elshuber |
| 3,953,783 A | 4/1976 | Peters, Jr. |
| 4,604,535 A | 8/1986 | Sasayama et al. |
| 5,341,004 A | 8/1994 | Furuhata |
| 5,504,449 A | 4/1996 | Prentice |
| 5,656,966 A | 8/1997 | Wilmot |
| 5,852,381 A | 12/1998 | Wilmot et al. |

(Continued)

FOREIGN PATENT DOCUMENTS

| | | |
|---|---|---|
| CN | 107546974 A1 | 1/2018 |
| GB | 2254209 A | 9/1992 |

(Continued)

OTHER PUBLICATIONS

"iCoupler Isolation Technology Presentation", Analog Devices, Mar. 2007, pp. 1-27.

*Primary Examiner* — Jung Kim
(74) *Attorney, Agent, or Firm* — Edward C. Kwok; VLP Law Group, LLP

(57) ABSTRACT

A gate driver circuit receiving an input control signal and providing a voltage at a gate terminal of a semiconductor switching device (e.g., an IGBT) may include: (i) a first voltage source providing a first voltage; (ii) a second voltage source providing a second voltage, wherein the first voltage is higher than the second voltage; and (iii) a selector circuit selecting, based on the input control signal's logic state, either the first voltage or the second voltage to be placed on the gate terminal of the semiconductor switching device.

10 Claims, 3 Drawing Sheets

(56) References Cited

U.S. PATENT DOCUMENTS

| | | | |
|---|---|---|---|
| 5,889,663 A | 3/1999 | Tabata et al. | |
| 6,097,582 A | 8/2000 | John et al. | |
| 6,304,460 B1 | 10/2001 | Cuk | |
| 6,373,232 B1 | 4/2002 | Mano et al. | |
| 6,381,152 B1 | 4/2002 | Takanhashi et al. | |
| 6,400,579 B2 | 6/2002 | Cuk | |
| 6,972,611 B1 | 12/2005 | Thalheim | |
| 7,265,601 B2 | 9/2007 | Ahmad | |
| 7,274,243 B2 | 9/2007 | Pace et al. | |
| 8,605,408 B2 | 12/2013 | Godo et al. | |
| 8,861,175 B2 | 10/2014 | Godo et al. | |
| 9,007,736 B2 * | 4/2015 | Uota | H03K 17/18 361/79 |
| 9,048,691 B2 | 6/2015 | Crane | |
| 9,407,253 B2 | 8/2016 | Cronin | |
| 9,444,448 B2 | 9/2016 | Wagoner et al. | |
| 9,503,072 B2 | 11/2016 | Saito et al. | |
| 9,564,891 B1 | 2/2017 | Bixby | |
| 9,762,114 B2 | 9/2017 | Lyle et al. | |
| 9,787,299 B2 | 10/2017 | Snook et al. | |
| 9,787,301 B2 | 10/2017 | Sato | |
| 10,136,503 B2 | 11/2018 | Chen | |
| 10,389,227 B2 | 8/2019 | Hokazono et al. | |
| 10,778,206 B2 * | 9/2020 | Kolcuoglu | H04B 1/44 |
| 2005/0253165 A1 | 11/2005 | Pace et al. | |
| 2009/0128974 A1 | 5/2009 | Ishikawa et al. | |
| 2010/0165681 A1 | 7/2010 | Sakano et al. | |
| 2012/0224288 A1 | 9/2012 | Uota et al. | |
| 2016/0301305 A1 | 10/2016 | Yamada | |
| 2017/0338812 A1 | 11/2017 | Hokazono et al. | |
| 2019/0003441 A1 | 1/2019 | Miura | |
| 2019/0053354 A1 | 2/2019 | Chen | |
| 2019/0261492 A1 | 8/2019 | Chen | |

FOREIGN PATENT DOCUMENTS

| | | |
|---|---|---|
| JP | 2005333444 A | 12/2005 |
| JP | 2007174134 A | 7/2007 |
| JP | 2009219017 A | 9/2009 |
| JP | 2017118717 A | 6/2017 |
| WO | 199809378 A1 | 3/1998 |

\* cited by examiner

GATE DRIVER CIRCUIT WITH REDUCED POWER SEMICONDUCTOR CONDUCTION LOSS

BACKGROUND OF THE INVENTION

1. Field of the Invention

The present invention relates to driver circuits for power semiconductor devices, such as driver circuits for insulated-gate bipolar transistors (IGBTs) or metal-oxide-semiconductor field-effect transistors (MOSFETs) in high-voltage, high-current applications.

2. Discussion of the Related Art

FIG. 1 shows conventional gate driver circuit 100 for driving a gate terminal of power semiconductor device 101. In FIG. 1, power semiconductor device 101 is exemplified by an IGBT; however, power semiconductor device 101 may be any one of numerous other devices (e.g., a MOSFET). As known to those of ordinary skill in the art, conventional gate driver circuit 100 often includes also signal isolation, power supply, monitoring and protection circuits. These other circuits are omitted from FIG. 1, for clarity of illustration. As shown in FIG. 1, gate driver circuit 100 includes (i) buffer stage 108 formed, for example, by bipolar junction transistors (BJTs) NPN BJT $Q_1$ and PNP BJT $Q_2$; and (ii) turn-on and turn-off gate resistors $R_{on}$ and $R_{off}$. Buffer stage 108 is connected between power supply circuit 109 (e.g., +15 volts) and the ground reference. Gate driver circuit 100 receives at input control signal 106 (e.g., an input control signal form a microprocessor) and provides an output signal at gate terminal 102 of IGBT 101. Input control signal 106 causes buffer stage 108 to turn on either NPN BJT $Q_1$ or PNP BJT $Q_2$ to charge or discharge the gate terminal of IGBT 101. Although NPN BJT $Q_1$ and PNP BJT $Q_2$ are used to illustrate buffer stage 108, other switching devices, such as MOSFETs, may also be used to implement buffer stage 108. When input control signal 106 is at a high voltage, NPN BJT $Q_1$ is conducting, thereby charging the capacitance of gate terminal 102 of IGBT 101 to the voltage of power supply circuit 109 through resistor $R_{on}$. Conversely, when the input control signal 106 is at a low voltage, PNP BJT $Q_2$ is conducting, thereby discharging the capacitance at gate terminal 102 of IGBT 101 to ground through resistor $R_{off}$.

Because of the transconductance of IGBT 101, current $i_C$ at collector terminal 103 of IGBT 101 is determined by the gate-emitter voltage ($V_{GE}$) across gate terminal 102 and emitter terminal 014 of IGBT 101. The higher voltage $V_{GE}$ is, the higher is current $i_C$, which results in a lower collector-emitter voltage ($V_{CE}$) at which current $i_C$ becomes saturated. To achieve the lowest possible conduction losses, a high voltage from power supply circuit 109 is preferred. However, the resulting higher gate-emitter voltage $V_{GE}$ may result in a correspondingly higher short-circuit current, if a short-circuit condition occurs. This is because, under a short circuit condition, the higher gate-emitter voltage ($V_{GE}$) causes collector current $i_C$ to increase more rapidly than when a lower gate-emitter voltage is present. Also, as gate terminal 102 is fully charged, collector current $i_C$ has a higher value, as IGBT 101 is operating at a higher desaturation current level. Taking all these factors into consideration, the output voltage of power supply circuit 109 is usually selected, as a trade-off, to be +15 volts.

Various schemes to improve the gate driver circuit of a power semiconductor device are known in the prior art. For example, U.S. Pat. No. 7,265,601 ("Ahmad"), entitled "Adaptive Gate Drive Voltage Circuit," discloses a method that reduces losses in a DC/DC converter by optimizing gate drive voltage. In Ahmad, the driver circuit adjusts the gate voltage based on the output load current; specifically, the gate voltage is reduced at a low load current and increased at a high load current. As another example, U.S. Pat. No. 9,444,448 ("Wagoner"), entitled "High performance IGBT gate drive," discloses applying one or more intermediate voltages near the IGBT's threshold voltage to control the rate of change of the collector-emitter voltage and the rate of change of the collector current during turn-off. Wagoner's scheme optimizes for reducing switching loss.

SUMMARY

According to one embodiment of the present invention, a gate driver circuit receiving an input control signal and providing a voltage at a gate terminal of a semiconductor switching device (e.g., an IGBT) may include: (i) a first voltage source providing a first voltage; (ii) a second voltage source providing a second voltage, wherein the first voltage is higher than the second voltage; and (iii) a selector circuit selecting, based on the input control signal's logic state, either the first voltage or the second voltage to be placed on the gate terminal of the semiconductor switching device. The selector circuit may delay the input control signal by a predetermined time interval.

In one embodiment, the selector circuit includes (i) a first transistor that, when in a conducting state, provides the first voltage source to the gate terminal of the semiconductor switching device, the first transistor having a gate terminal that receives an enable signal that causes it to switch between the conducting state and a non-conducting state; and (ii) a second transistor that receives the input control signal and that, according to the input control signal's logic state, provides the enable signal to the gate terminal of the first transistor. An RC circuit may be provided in the signal path of the enable signal, such that, when the first transistor connects the first voltage source to the gate terminal of the semiconductor switching device, the voltage at the gate terminal of the semiconductor devices rises to the first voltage at a slew rate determined by the RC circuit.

In one embodiment, a buffer stage is connected between a power supply terminal and a ground reference, wherein the selector circuit provides the selected voltage at the power supply terminal of the buffer stage, and wherein the buffer stage has an output terminal coupled to the gate terminal of the semiconductor switching device, and wherein, based on the input control signal's logic state, the buffer stage provides the voltage at its power supply terminal to its output terminal. The output terminal of the buffer stage may be coupled to the gate terminal of the semiconductor switching device by a resistor.

In one embodiment, the second voltage source may include a voltage regulator that receives the first voltage as an input voltage, and wherein the voltage regulator provides the second voltage as a regulated output voltage.

In one embodiment, the circuitry in the gate driver circuit is divided into a high-voltage domain and a low voltage domain that are isolated from each other, wherein the first and the second voltages are signals in the high-voltage domain and wherein the input control signal is a signal in the low-voltage domain.

The input control signal may be provided from a control circuit, such as a microprocessor.

BRIEF DESCRIPTION OF THE DRAWINGS

To facilitate cross-referencing among the figures, like elements are assigned like reference numerals.

DETAILED DESCRIPTION OF THE PREFERRED EMBODIMENTS

Figure 1:
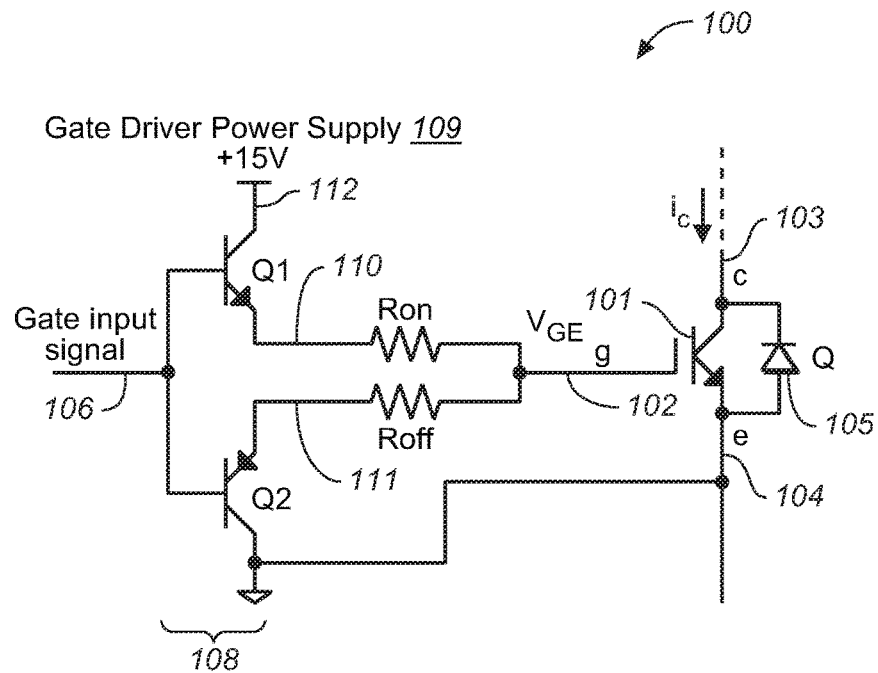
FIG. 1 shows conventional gate driver circuit 100 for driving a gate terminal of power semiconductor device 101.
Figure 2:
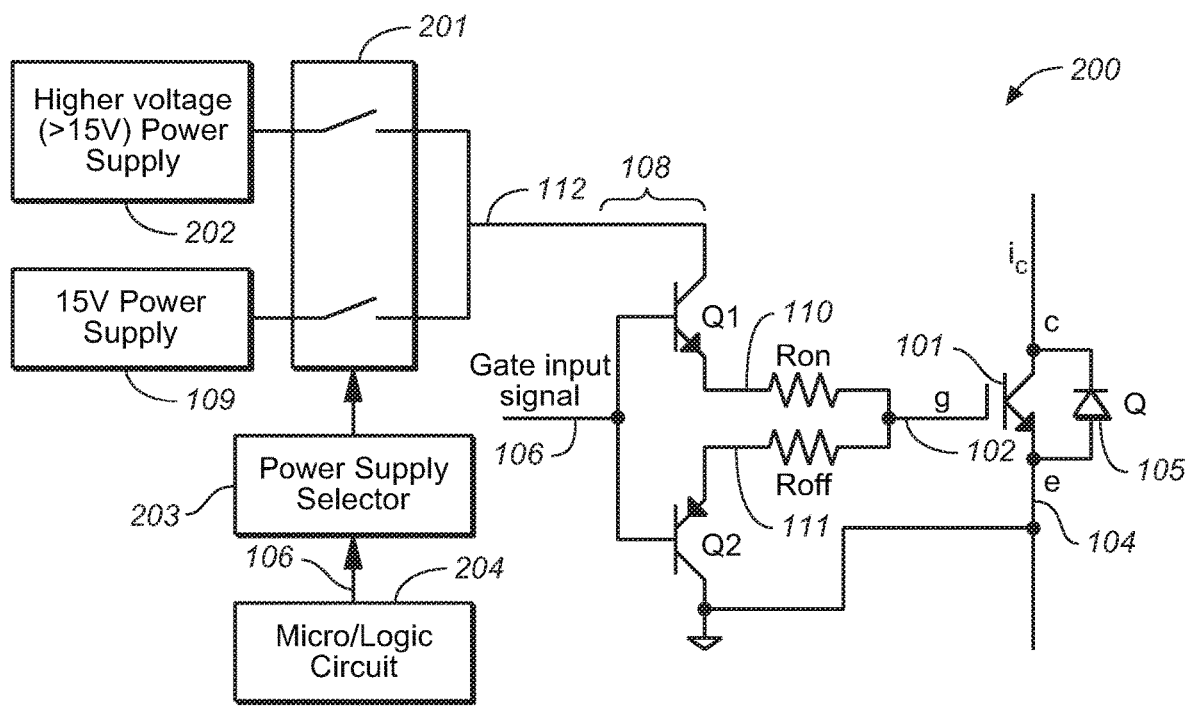
FIG. 2 shows gate driver circuit 200, in accordance with one embodiment of the present invention.

The present invention provides a gate driver circuit that provides an adjustable output power supply voltage for driving the gate terminal of a power semiconductor device. The adjustable output power supply voltage reduces the saturation voltage in the power semiconductor device during turn-on, without compromising its desirable short-circuit current characteristics. FIG. 2 shows gate driver circuit 200, in accordance with one embodiment of the present invention. In FIG. 2, in addition to power supply circuit 109, buffer stage 108, turn-on and turn-off resistors $R_{on}$ and $R_{off}$ of FIG. 1, gate driver circuit 200 also include higher-voltage power supply circuit 202, power supply selection circuit 201, power supply selector circuit 203 and control circuit 204. In gate driver circuit 200, power supply selector circuit 203 causes power supply selection circuit 201 to select the output voltage of either power supply circuit 109 or higher voltage power supply circuit 202 to place at terminal 112 as the power supply voltage to drive gate terminal 102 of IGBT 101, during different times of IGBT operations. Higher-voltage power supply circuit 202 provides at terminal 112 a higher voltage (e.g., 18.5 volts) than the voltage (e.g., 15 volts) supplied by power supply circuit 109. Power supply selection circuit 201 may be implemented by one or more semiconductor switches and power supply selector circuit 203 may be implemented by a logic circuit that operates the switches in power supply selection circuit 201.

Figure 3:
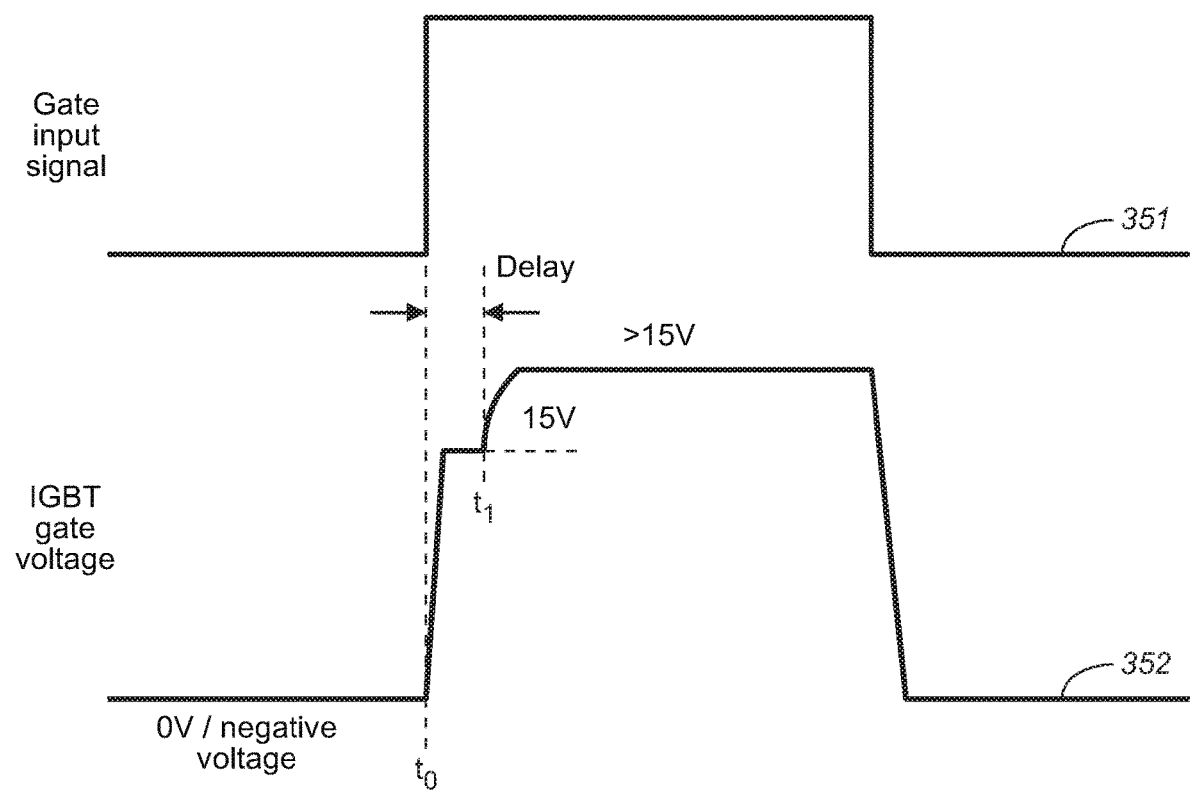
FIG. 3 illustrates an operation of power supply selector circuit 203, in accordance with one embodiment of the present invention.

FIG. 3 illustrates an operation of power supply selector circuit 203, in accordance with one embodiment of the present invention. As shown in FIG. 3, waveform 351 represents input control signal 106 received into buffer stage 108 and power supply selector circuit 203. Waveform 352 represents the voltage waveform at gate terminal 102. When IGBT 101 is turned off, the voltage at terminal 112 is provided by power supply circuit 109 (i.e., 15 volts). When input control signal 106 goes high at time $t_0$, turn-on transistor $Q_1$ turns on and gate terminal 102 of IGBT 101 goes to the lower supply voltage (i.e., 15 volts), such that collector current $i_C$ increases at a limited slew rate. Therefore, if a short-circuit condition exists at this time, the short-circuit current is limited by the lower power supply voltage. With the lower power supply voltage at its gate terminal 102, the desaturation current in IGBT 101 is also limited.

After a predetermined delay (i.e., time interval $(t_1-t_0)$), power supply selector circuit 203 causes the voltage at terminal 112 to be sourced from higher-voltage power supply 202 (e.g., at 18.5 volts), which increases the voltage at gate terminal 102 of IGBT 101. At this higher voltage, IGBT 101's saturation voltage across collector terminal 103 and emitter terminal 104 (i.e., $V_{CE}$) is reduced. When input control signal 106 returns to low, power supply selector circuit 203 causes the voltage at terminal 112 to be sourced from power supply circuit 109 (i.e., returning terminal 112 to 15 volts). In some embodiments, the transition between power supply circuit 109 to higher-voltage power supply circuit 202 (i.e., from 15 volts to 18.5 volts), and vice versa, can occur gradually over a predetermined time period. For example, the transition can be controlled by an RC circuit; in that case, the voltage at terminal 112 rises or falls at a rate that may be characterized by a time constant.

Figure 4:
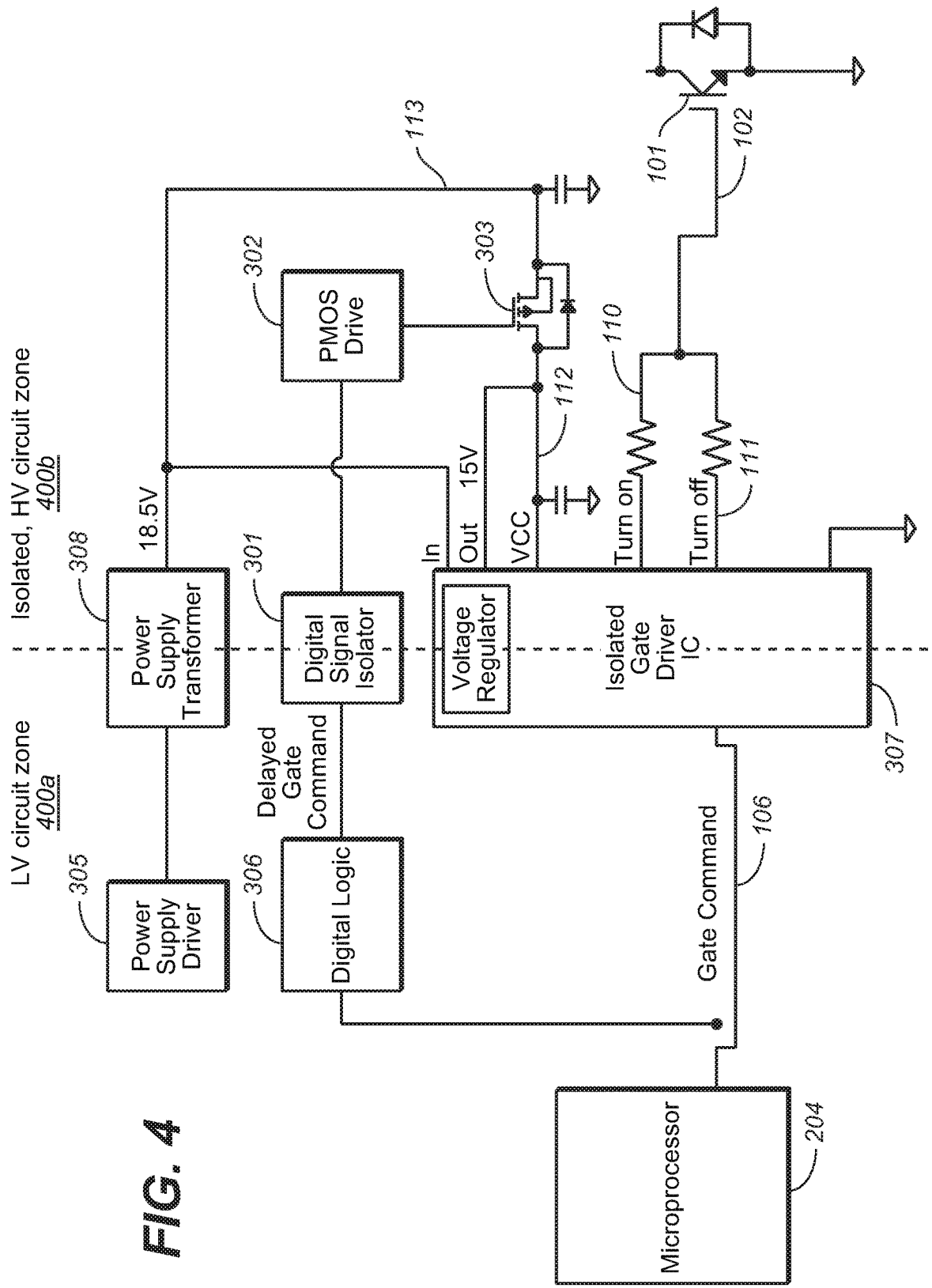
FIG. 4 shows gate driver circuit 400, which is one implementation of gate driver circuit 200 of FIG. 2.

FIG. 4 shows gate driver circuit 400, which is one implementation of gate driver circuit 200 of FIG. 2. As shown in FIG. 4, the circuitry of gate driver circuit 400 is divided into low-voltage domain 400a and high-voltage domain 400b. Low-voltage domain 400a includes logic circuits that provides the control functions of gate driver circuit 400 and high-voltage domain 400b includes high-voltage circuitry that drive gate terminal 102 of IGBT 101. Circuitry in low-voltage domain 400a may be isolated from circuitry in high-voltage domain 400b using conventional isolation techniques, such as optical isolation or other semiconductor devices.

As show in FIG. 4, power supply transformer 308 implements the higher supply voltage (e.g., 18.5 volts) of higher-voltage power supply circuit 202 of FIG. 2. Power supply transformer 308 is enabled and initialized by a low-voltage logic circuit (i.e., power supply driver 305). Control circuit 204 of FIG. 2 is implemented in gate driver circuit 400 by microprocessor 204, which issues input control signal 106 to logic circuit 306 and isolated gate driver integrated circuit 307. Isolated gate driver integrated circuit 307, which receives the higher supply voltage from higher-voltage power supply circuit 202, includes voltage regulator 309 which provides a regulated output voltage (e.g., 15 volts) on terminal 112. In this manner, isolated gate driver integrated circuit 307 implements power supply circuit 109. In addition, buffer stage 108 is also implemented in isolated gate driver integrated circuit 307 by supplying the voltage at terminal 112 to terminal 110 during turn-on and by grounding terminal 111 during turn-off. Isolated gate driver integrated circuit 307 may be implemented by, for example, an MC33GD3100 integrated circuit from NXP semiconductors N.V.

In one embodiment, digital logic circuit 306 delays input control signal 106 by the predetermine delay (e.g., time interval $(t_1-t_0)$ in FIG. 2). The delayed input control signal enters high-voltage domain 302 through digital signal isolator circuit 301 to turn on PMOS driver 302 which, in turn, turns on PMOS transistor 303. Conducting PMOS transistor 303 places the higher supply voltage of power supply transformer 308 on terminal 112. PMOS driver 302 may be implemented by a bipolar transistor (e.g., a un2217 bipolar transistor) driving an RC circuit that achieves a more gradual slew rate (i.e., with an RC time constant) to transition to the higher supply voltage. As the voltage at terminal 112 rises, voltage regulator 309 turns off, and the higher supply voltage is provided on terminal 110 of turn-on resistor $R_{on}$. During turn-off, PMOS driver 302 turns off PMOS transistor 303 and terminal 112 returns to the regulated output voltage of voltage regulator 309.

Without impacting short-circuit performance, the method of the present invention drives the gate terminal of a power semiconductor device at a higher power supply voltage to achieve a reduced saturation voltage in the power semiconductor device during conduction. In this manner, the trade-off in a conventional gate driver circuit between a lower saturation voltage when the power semiconductor device is conducting and a high short-circuit current is avoided. Since the voltage at the gate terminal of the power semiconductor device is increased during its conducting state, the power semiconductor device's conduction loss is reduced, thereby resulting in both enhanced system efficiency and a reduced thermal stress.

The above detailed description is provided to illustrate specific embodiments of the present invention and is not intended to be limiting. Numerous variations and modifications within the scope of the present invention are possible. The present invention is set forth in the accompanying claims.

We claim:

1. A gate driver circuit receiving an input control signal and providing a voltage at a gate terminal of a semiconductor switching device, comprising:
    a first voltage source providing a first voltage;
    a second voltage source providing a second voltage, wherein the first voltage is higher than the second voltage and wherein the second voltage turns on the semiconductor switching device when provided to the gate terminal of the semiconductor switching device;
    a buffer stage connected between a power supply terminal and a ground reference;
    a selector circuit selecting, based on the input control signal's logic state, either the first voltage or the second voltage to be placed on the gate terminal of the semiconductor switching device, wherein the selector circuit provides the selected voltage to the power supply terminal of the buffer stage.

2. The gate driver circuit of claim 1, wherein the selector circuit delays the input control signal by a predetermined time interval.

3. The gate driver circuit of claim 1, wherein the selector circuit comprises:
    a first transistor that, when in a conducting state, provides the first voltage to the gate terminal of the semiconductor switching device, the first transistor having a gate terminal that receives an enable signal that causes it to switch between the conducting state and a non-conducting state; and
    a second transistor that receives the input control signal and that, according to the input control signal's logic state, provides the enable signal to the gate terminal of the first transistor.

4. The gate driver circuit of claim 3, further comprises an RC circuit in the signal path of the enable signal, such that, when the first transistor connects the first voltage source to the gate terminal of the semiconductor switching device, the voltage at the gate terminal of the semiconductor devices rises to the first voltage at a slew rate determined by the RC circuit.

5. A gate driver circuit receiving an input control signal and providing a voltage at a gate terminal of a semiconductor switching device, comprising:
    a first voltage source providing a first voltage;
    a second voltage source providing a second voltage, wherein the first voltage is higher than the second voltage;
    a selector circuit selecting, based on the input control signal's logic state, either the first voltage or the second voltage to be placed on the gate terminal of the semiconductor switching device; and
    a buffer stage connected between a power supply terminal and a ground reference, wherein the selector circuit provides the selected voltage at the power supply terminal of the buffer stage, wherein the buffer stage includes an output terminal coupled to the gate terminal of the semiconductor switching device, and wherein, based on the input control signal's logic state, the buffer stage provides the voltage at its power supply terminal to its output terminal.

6. The gate driver circuit of claim 5, wherein the output terminal of the buffer stage is coupled to the gate terminal of the semiconductor switching device by a resistor.

7. The gate driver circuit of claim 1, wherein the second voltage source comprises a voltage regulator receiving the first voltage as an input voltage, and wherein the voltage regulator provides the second voltage as a regulated output voltage.

8. The gate driver circuit of claim 1, comprising a high-voltage domain and a low voltage domain that are isolated from each other, wherein the first and the second voltages are signals in the high-voltage domain and wherein the input control signal is a signal in the low-voltage domain.

9. The gate driver circuit of claim 1, wherein the input control signal is received from a control circuit.

10. The gate driver circuit of claim 9, wherein the control circuit comprises a microprocessor.

* * * * *